(12) United States Patent
Ohe et al.

(10) Patent No.: US 7,330,492 B2
(45) Date of Patent: Feb. 12, 2008

(54) OPTICAL COUPLER AND ELECTRONIC EQUIPMENT USING SAME

(75) Inventors: Nobuyuki Ohe, Katsuragi (JP); Kazuhito Nagura, Kashihara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 408 days.

(21) Appl. No.: 11/017,914

(22) Filed: Dec. 22, 2004

(65) Prior Publication Data

US 2005/0141584 A1    Jun. 30, 2005

(30) Foreign Application Priority Data

Dec. 24, 2003  (JP)  .......................... P2003-426420

(51) Int. Cl.
*H01S 5/00*       (2006.01)
(52) U.S. Cl. .................................. 372/50.1; 372/50.124
(58) Field of Classification Search ................ 372/50.1, 372/50.124
See application file for complete search history.

(56) References Cited

U.S. PATENT DOCUMENTS

| 6,184,544 | B1 | 2/2001 | Toda et al. | |
| 6,335,545 | B1 | 1/2002 | Toda et al. | |
| 6,451,622 | B1 * | 9/2002 | Sawai | .......................... 438/65 |
| 6,731,882 | B1 * | 5/2004 | Althaus et al. | .............. 398/139 |
| 6,781,209 | B1 | 8/2004 | Althaus et al. | |
| 2002/0182774 | A1 | 12/2002 | Heckman | |
| 2004/0188697 | A1 | 9/2004 | Brunner et al. | |
| 2005/0111845 | A1 * | 5/2005 | Nelson et al. | .............. 398/138 |
| 2005/0184374 | A1 | 8/2005 | Ohe et al. | |
| 2006/0018608 | A1 | 1/2006 | Mizoguchi | |

FOREIGN PATENT DOCUMENTS

| DE | 19901918 | 7/1999 |
| DE | 19935496 | 1/2001 |
| DE | 19947889 | 5/2001 |
| DE | 10131698 | 1/2003 |
| DE | 10150986 | 4/2003 |
| JP | 2000-173947 A | 6/2000 |

* cited by examiner

*Primary Examiner*—Armando Rodriguez
(74) *Attorney, Agent, or Firm*—Birch, Stewart, Kolasch & Birch, LLP

(57) ABSTRACT

On one surface of a lead frame 4 having an aperture 7 passing through in thickness direction thereof, a submount having transparency for closing the aperture 7 of the lead frame 4 is disposed. On a surface of the submount opposite to a surface of the submount 8 facing the aperture 7 of the lead frame 4, a semiconductor optical device 3 is disposed in such a way that an optical portion thereof faces toward the aperture. The semiconductor optical device 3 is electrically connected to the lead frame 4 via wire 5. At least one surface of the lead frame 4, the semiconductor optical device 3 and the submount 8 are encapsulated with a molding portion 10 made of a non-transparent molding resin in a state that the aperture 7 on the other surface side of the lead frame 4 is exposed.

15 Claims, 9 Drawing Sheets

OPTICAL COUPLER AND ELECTRONIC EQUIPMENT USING SAME

CROSS-REFERENCE TO RELATED APPLICATION

This nonprovisional application claims priority under 35 U.S.C. §119(a) on Patent Application No. 2003-426420 filed in Japan on Dec. 24, 2003, the entire contents of which are hereby incorporated by reference.

BACKGROUND OF THE INVENTION

The present invention relates to an optical coupler having a semiconductor optical device and to electronic equipment using the same, and more particularly, relates to an optical coupler for use in optical communication links and so forth for sending and receiving optical signals with an optical fiber as a transmission medium, and electronic equipment using the same.

Conventionally, there have been known optical couplers coupling semiconductor optical devices such as LEDs (Light Emitting Diodes) and PDs (Photo Diodes) to optical fibers, which have been used for optical communications between equipments, at home and in automobiles.

As these optical couplers, those manufactured utilizing transfer molding of transparent resin as shown in FIG. 10 are widely used. An optical coupler 101 shown in FIG. 10 is structured such that an semiconductor optical device 103 disposed on a lead frame 104 is encapsulated with a transparent resin 110, and the semiconductor optical device 103 is optically coupled to an optical fiber 102 through a lens 108 formed out of part of the transparent resin 110. The semiconductor optical device 103 is electrically connected to the lead frame 104 via wire 105. Further, in some cases, a semiconductor device for driving and controlling the semiconductor optical device 103 is mounted on the lead frame 104. Such optical couplers utilizing transfer molding have a characteristic of being easily manufactured at low costs compared to, for example, optical couplers using a glass lens.

It is known that doping resin molding materials with fillers allows adjustment of a coefficient of linear expansion and heat conductivity, and so semiconductor devices which do not need an optical property are encapsulated with molding resins (normally black) added with fillers. Since the above-mentioned optical coupler 101 using the transparent resin 110 put emphasis on the optical property, it was difficult to add the resin with a filler (or the resin is added only with a small amount of the filler), and so the optical coupler 101 had a problem in environmental resistance (including thermal shock resistance and heat dissipation).

Accordingly, as shown in FIG. 11, there has been proposed an optical coupler with a modified structure in which encapsulating is made by a color molding resin added with a filler (see, e.g., JP 2000-173947 A). In an optical coupler 201 shown in FIG. 11, the semiconductor optical device 203 is mounted on a lead frame 204 with only an optical portion 206 thereof being adhered to a glass lens 208, and electrodes around the optical portion 206 of the semiconductor optical device 203 are electrically connected to the lead frame 204 via wire 205. Then, transfer molding is conducted with a color molding resin 209 added with a filler, which makes it possible to encapsulate the semiconductor optical device 203 and the wire 205 with the color molding resin 209 without the color molding resin 209 blocking an optical path through which light comes into and goes out from the semiconductor optical device 203.

As shown in FIG. 11, the optical coupler is structured such that the glass lens 208 is mounted on the optical portion 206 and the semiconductor optical device 203 is encapsulated with the color molding resin 209 with a part of the glass lens 208 included in the color molding resin 209. However, a practical means to perform resin encapsulating with this structure is not disclosed in JP 2000-173947 A. Generally, resin for use in transfer molding has small particles, which induces a phenomenon of resin leaking from a space of several μm. Therefore, it is considered to be difficult to realize such a structure stated in JP 2000-173947 A. Moreover, in the case of using a semiconductor optical device with a relatively large size (several mm to several dozen mm square) such as CCDs (Charge Coupled Devices), it is possible to dispose a glass lens on an optical portion. However, a semiconductor optical device with a small size (several hundred μm square) such as LEDs, which has an extremely small optical portion, needs to use a glass lens that is also extremely small in size, thereby causing problems including: (i) it is difficult to design a lens which can offer optical effects; (ii) it is difficult to manufacture a minute glass lens; and (iii) it is difficult to bond and align the optical portion and the glass lens. Further, if a glass lens that is larger than the optical portion of the semiconductor optical device is used, electrodes close to the optical portion of the semiconductor optical device are also bonded to the glass lens, which makes it impossible to conduct wire bonding.

For the above-stated optical coupler, there has also been disclosed a method with use of a resin lens. However, in the case of using the semiconductor optical device having a small size such as LEDs, its optical portion is small and so there is difficulty in practical application due to the same reasons. Further, in the case of using the resin lens, due to the heat resistance of the lens, it is necessary to perform molding with a color molding resin before the resin lens is mounted, which makes it necessary to hold the optical portion of the semiconductor optical device and a mold by pressure contact or with a minute gap so as to prevent a color resin from coming into the optical portion of the semiconductor optical device. This necessitates damage prevention of the semiconductor optical device and high-accuracy mold management (as well as deformation prevention of a lead frame), bringing about difficulty in manufacturing. Particularly in the case of the semiconductor optical device with a small size such as LEDs, it is extremely difficult to manage so as to prevent the color molding resin from coming into the optical portion while protecting wires.

Moreover, the transparent molding resin, the semiconductor optical device, the lead frame and the bonding wire are generally different in a coefficient of linear expansion. Consequently, in the range of high operating-temperatures, breaking of the bonding wire, package cracks and so forth occur, making it exceedingly difficult to manufacture the optical coupler with high reliability.

SUMMARY OF THE INVENTION

In consideration of the above situations, an object of the present invention is to provide an optical coupler capable of offering excellent environment resistance and high reliability with a simple structure, achieving reduction in both size and price with high coupling efficiency, and using a semiconductor optical device with a small size such as LEDs and PDs, and electronic equipment using the same.

In order to accomplish the above object, an optical coupler of the present invention comprises:

a lead frame having an aperture passing through in thickness direction thereof;

a submount having transparency which is disposed on one surface of the lead frame so as to close the aperture of the lead frame;

a semiconductor optical device which is disposed on a surface of the submount opposite to a surface of the submount facing the aperture of the lead frame in such a way that an optical portion of the semiconductor optical device faces toward the aperture, and which is electrically connected to the lead frame via wire; and a molding portion made of a non-transparent molding resin for encapsulating at least one surface of the lead frame, the semiconductor optical device and the submount in a state that the aperture on the other surface side of the lead frame is exposed.

According to the above structure, at least one surface of the lead frame, the semiconductor optical device and the submount are encapsulated with the molding portion made of the non-transparent molding resin in the state that the aperture on the other surface side of the lead frame is exposed. In the case where the semiconductor optical device is, for example, a light-receiving device, incident light through the aperture passing through in thickness direction of the lead frame passes through the submount having transparency and becomes incident to the optical portion (light-receiving face) of the semiconductor optical device disposed on the surface of the submount opposite to the surface of the submount facing the aperture of the lead frame. In the case where the semiconductor optical device is a light-emitting device, outgoing light from the optical portion (emitting surface) of the semiconductor optical device passes through the submount having transparency and goes out through the aperture of the lead frame. Therefore, with a simple structure, it becomes possible to reliably encapsulate the semiconductor optical device and the wire with an non-transparent molding resin, allowing realization of the optical coupler with excellent environment resistance and high reliability. Further, it becomes possible to satisfy reduction in both size and price with high coupling efficiency, and to use the semiconductor optical device with a small size such as LEDs and PDs.

Further, in one embodiment, the non-transparent molding resin includes a 70 wt % or more filler.

According to the above embodiment, using a non-transparent molding resin containing a 70 wt % or more filler makes it possible to decrease difference in a coefficient of linear expansion among the semiconductor optical device, the lead frame and the bonding wire, which allows manufacturing of the optical coupler with high reliability free from breaking of the bonding wire or package cracks.

Further, in one embodiment, the submount is provided with an electrode which is electrically connected to a front-surface electrode of the semiconductor optical device.

According to the above embodiment, bonding the electrode to the semiconductor optical device concurrently with mounting of the semiconductor optical device on the submount allows easy electric connection between the semiconductor optical device and the submount, which makes it possible to achieve downsizing of the optical coupler and space saving thereby.

Further, in one embodiment, a space between the submount and the optical portion of the semiconductor optical device is filled with a transparent resin.

According to the above embodiment, an air layer is not present between the semiconductor optical device and the submount, which allows realization of the optical coupler with high coupling efficiency.

Further, in one embodiment, the electrode mounted on the submount has at least one notch.

According to the above embodiment, when filling the transparent resin into a clearance between the submount and the optical portion of the semiconductor optical device, the transparent resin is introduced with use of the notch provided on the electrode of the submount, which allows easy filling of the transparent resin.

Further, in one embodiment, the submount has a lens which is disposed inside the aperture of the lead frame.

According to the above embodiment, the lens provided on the submount makes it possible to increase the coupling efficiency of an optical fiber and the semiconductor optical device.

Further, one embodiment further comprises a signal processing integrated circuit which is disposed on the lead frame and is electrically connected to the semiconductor optical device.

According to the above embodiment, the semiconductor optical device and the signal processing integrated circuit can be manufactured as a single package, thereby realizing downsizing and space saving.

Further, in one embodiment, the semiconductor optical device is a light-receiving device, and the signal processing integrated circuit is an amplifying integrated circuit for amplifying an output signal from the light-receiving device, and the light-receiving device and the amplifying integrated circuit are formed in a single chip.

According to the above embodiment, wire between the light-receiving device and the amplifying integrated circuit is not necessary, so that a stray capacitance is reduced and fast response is obtainable. Moreover, since the number of chips is decreased, manufacturing is facilitated and cost reduction can be achieved.

Further, in one embodiment the semiconductor optical device includes a light-emitting device and a light-receiving device, and the signal processing integrated circuit includes a driving integrated circuit for driving the light-emitting device and an amplifying integrated circuit for amplifying an output signal from the light-receiving device.

According to the above embodiment, covering the light-emitting device and the light-receiving device separately with the non-transparent molding resin makes it possible to remove an influence of stray light noise to achieve communication with high communication quality with a simple structure and to achieve downsizing.

Further, in one embodiment, the driving integrated circuit and the amplifying integrated circuit are formed in a single chip.

According to the above embodiment, the number of chips is decreased, which facilitates manufacturing and allows cost reduction.

Further, in one embodiment, the signal processing integrated circuit includes at least one of an output external connection terminal for outputting information regarding operational states and an input external connection terminal for receiving control information.

According to the above embodiment, the output signal from the output external communication terminal and the input signal from the input external communication terminal make it possible to control operation of the signal processing circuit, thereby allowing sophisticated communication with high communication quality.

Further, in one embodiment, the molding portion made of the non-transparent molding resin is provided in such a way that an almost entire surface of the other surface of the lead frame is exposed.

According to the above embodiment, the cost can be reduced and downsizing can be achieved with a structure which facilitates manufacturing.

Further, in one embodiment, the molding portion made of the non-transparent molding resin has an engagement portion provided on the other surface side of the lead frame in such a way that the lead frame is interposed in between the molding portion on the one surface side of the lead frame and the engagement portion.

According to the above embodiment, the lead frame is interposed in between the molding portion on one surface side of the lead frame and the engagement portion, so that the non-transparent molding resin may be reliably engaged with the lead frame, making it possible to achieve high reliability and downsizing.

Further, in one embodiment, the molding portion made of the non-transparent molding resin covers the other surface of the lead frame except a hole portion that exposes the aperture.

According to the above embodiment, the hole portion in the molding portion made of the non-transparent molding resin facilitates and ensures alignment of the optical coupler and an optical fiber, so that communication with high communication quality is achieved. Moreover, it is not necessary to separately provide an alignment means, which makes it possible to achieve downsizing.

Further, in one embodiment, the hole portion in the molding portion made of the non-transparent molding resin is shaped to become narrower from its opening toward the aperture side of the lead frame.

According to the above embodiment, alignment of the optical fiber becomes more secure, and the hole portion is shaped to become narrower from its opening toward the lead frame side to collect light, so that in the case where the semiconductor optical device is, for example, a light-receiving device, induction of incident light is facilitated, and light-receiving efficiency is improved.

Further, electric equipment of one embodiment includes the above optical coupler.

According to the electronic equipment, using the optical coupler makes it possible to improve reliability as well as to achieve downsizing and cost reduction.

As is clear from the above description, according to the optical coupler of the present invention, even in the case where a small-size semiconductor optical device as PDs and LEDs is used, it is possible with a simple structure to encapsulate the semiconductor optical device and the wire with the non-transparent molding resin excellent in environment resistance, which makes it possible to provide a small-size optical coupler with excellent environment resistance and high reliability at a low cost. Moreover, imparting a light collecting function (e.g., lens) to the aperture of the lead frame and the submount allows improvement of the optical coupling efficiency.

Further, since the light-receiving device and the amplifying integrated circuit are formed in a single chip, wire between the light-receiving device and the amplifying integrated circuit is not necessary, so that a stray capacitance is reduced and fast response is obtainable. Moreover, since the number of chips is decreased, manufacturing is facilitated and cost reduction can be achieved.

Further, the light-emitting device, the light-receiving device, the driving integrated circuit for the light-emitting device, the amplifying integrated circuit for the light-receiving device are formed in a single package and encapsulated with the non-transparent molding resin, so that an influence of stray light noise can be eliminated without a complicated mechanism, which allows communication with high communication quality and makes it possible to achieve downsizing.

Further, the semiconductor optical coupler incorporates at least one of the output external connection terminal and the input external connection terminal for receiving and supplying information regarding operational states and control information from and to the driving integrated circuit for the light-emitting device and the amplifying integrated circuit for the light-receiving device, which allows sophisticated communication with high communication quality.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE PREFERRED EMBODIMENTS

Hereinbelow, an optical coupler and electronic equipment using the same in the present invention will be described in detail in conjunction with the embodiments with reference to the accompanying drawings.

The First Embodiment

Figure 1A:
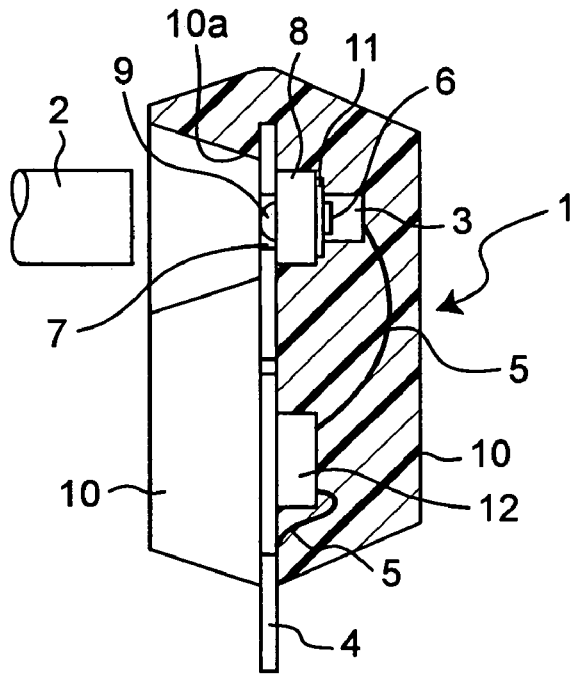
FIGS. 1A and 1B are a schematic sectional view and a front view respectively showing an outlined structure of an optical coupler according to a first embodiment of the present invention.
Figure 1B:
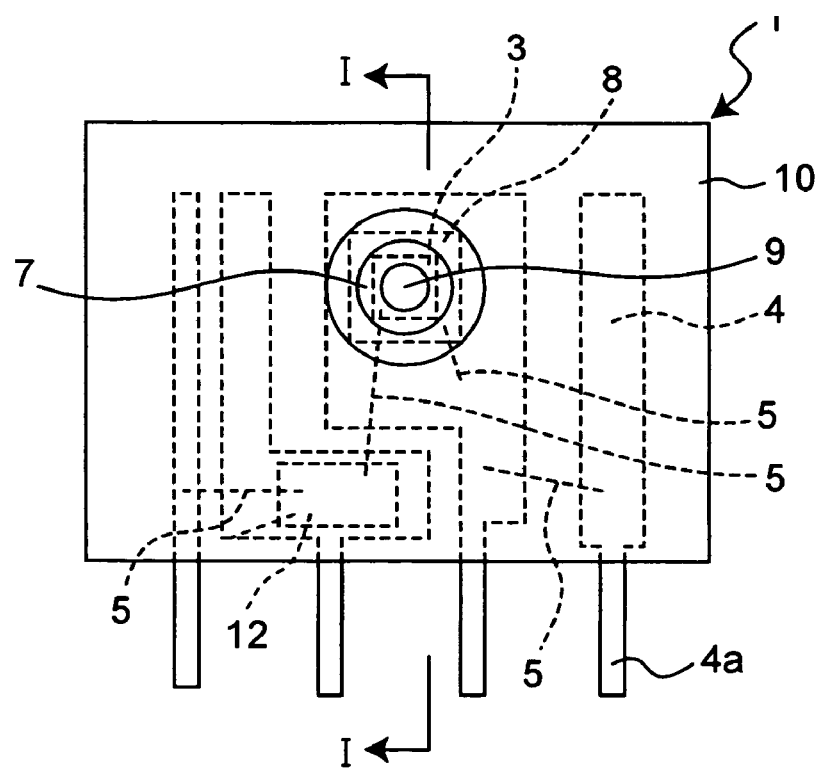

FIG. 1A is a schematic sectional view showing an outlined structure of an optical coupler according to a first embodiment of the present invention, and FIG. 1B is a front view showing the optical coupler viewed from the side of an optical fiber 2. FIG. 1A shows a section taken along a line I-I of FIG. 1B.

As shown in FIGS. 1A and 1B, the optical coupler 1 includes a semiconductor optical device 3, a lead frame 4 on which the semiconductor optical device 3 is disposed, a glass submount 8 exemplifying a submount having light transmission, a lens 9 provided on the glass submount 8, and a signal processing circuit (semiconductor device) 12 exemplifying a signal processing integrated circuit. At a position of the lead frame 4 opposed to an optical portion 6 of the semiconductor optical device 3, there is formed an aperture 7 passing through in thickness direction. The optical portion 6 herein refers to a portion for emitting light of the semiconductor optical device 3 or a portion for receiving light, which represents, for example, a light-emitting face in LEDs and a light-receiving face in PDs.

The semiconductor optical device 3 is bonded to the glass submount 8 in the state of having electric conduction thereto with the optical portion 6 facing the lead frame 4 in the direction opposite to the normal disposition direction (face-down layout). The glass submount 8 is equipped with electrodes (unshown) so as to be electrically connected to electrodes (unshown) of the semiconductor optical device 3. The electric bonding between the electrodes of the glass submount 8 and the electrodes of the semiconductor optical device 3 is established through gold-tin eutectic bonding, use of an Ag paste, use of an Au bump and so forth. Both the electrodes of the glass submount 8 and the semiconductor optical device 3 are provided so as not to block an optical path of the optical portion 6.

When the glass submount 8 is electrically bonded to the semiconductor optical device 3, an air layer is generated between the glass submount 8 and the optical portion 6 of the semiconductor optical device 3. With generation of such an air layer, efficiency to extract light from the light-emitting device (transmission efficiency) is degraded if the semiconductor optical device 3 is a light-emitting device, while coupling efficiency of the light-receiving device (reception efficiency) is degraded if the semiconductor optical device 3 is a light-receiving device. Thus, the optical coupler in the first embodiment is structured such that clearance between the glass submount 8 and the semiconductor optical device 3 is filled with a transparent resin portion 11 so as to prevent generation of an air layer and to prevent degradation of the transmission efficiency and the reception efficiency. As the transparent resin, silicon, epoxy resin and so forth are used.

Further, the lens 9 provided on the glass submount 8, which is provided for improving the transmission efficiency in the light-emitting device or the reception efficiency in the light-receiving device, may be manufactured integrally with the glass submount 8 or may be manufactured separately and bonded thereto. Thus, a rear-surface electrode of the semiconductor optical device 3 and the signal processing circuit 12 are electrically connected through wire 5, the glass submount 8 and the lead frame 4 are electrically connected through wire 5, the signal processing circuit 12 and the lead frame 4 are electrically connected through wire 5, and the lead frames 4 are electrically connected to each other through wire 5.

Figure 2A:
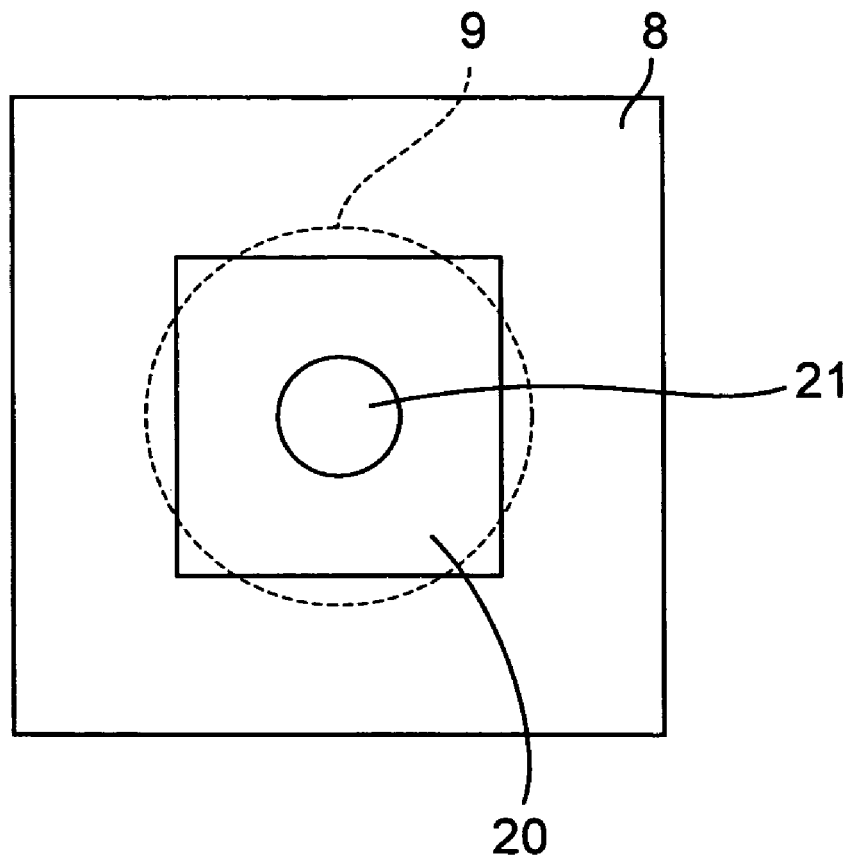
FIGS. 2A and 2B are a bottom view and a side view respectively showing an outlined structure of a submount of the optical coupler according to the first embodiment.
Figure 2B:
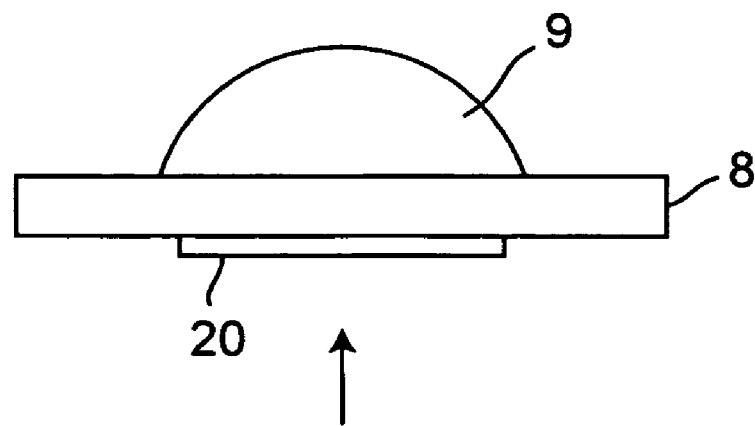

FIG. 2A is a bottom view showing a submount of the optical coupler according to the first embodiment of the present invention viewed from the electrode side, and FIG. 2B is a side view of the submount 8.

In FIGS. 2A and 2B, on one surface of the glass submount 8, there is provided an electrode 20 which is electrically connected to a front-surface electrode of the semiconductor optical device (unshown), and the electrode 20 is each provided with an almost circular-shaped optical path hole 21 so as not to block an optical portion (i.e., a light-emitting portion and a light-receiving portion) of the semiconductor optical device.

The front-surface electrode of the semiconductor optical device is electrically connected to the electrode 20 through gold-tin eutectic bonding, use of an Ag paste, use of an Au bump and so forth as described above.

The optical path hole 21 is filled with a transparent resin for preventing degradation of transmission efficiency or reception efficiency of the semiconductor optical device.

In the case of the submount 8 in FIGS. 2A and 2B, for establishing electric bonding between the front-surface electrode of the semiconductor optical device and the electrode 20 of the submount 8, first, the optical path hole 21 is filled with a transparent resin, the front-surface electrode of the semiconductor optical device and the electrode 20 of the submount 8 are electrically connected, and a space between the semiconductor optical device and the submount 8 is filled with a transparent resin.

Figure 3A:
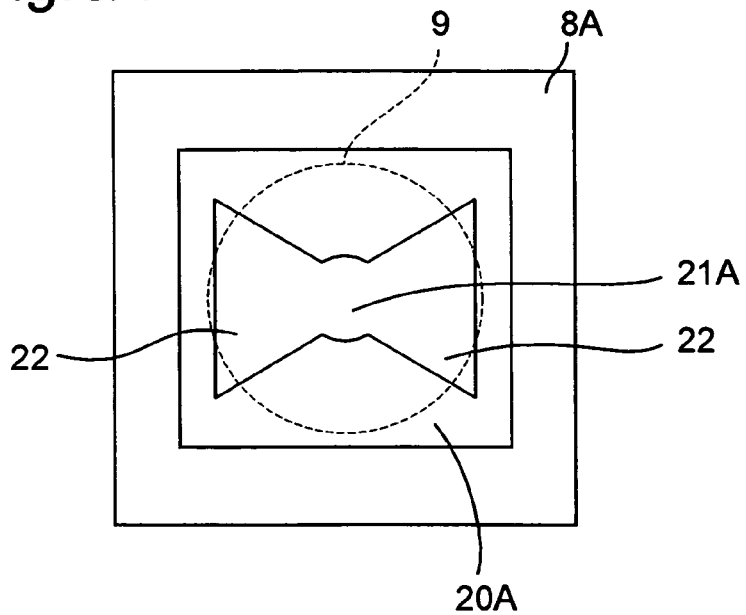
FIGS. 3A and 3B are a bottom view and a side view respectively showing another structure of a submount of the optical coupler according to the first embodiment.
Figure 3B:
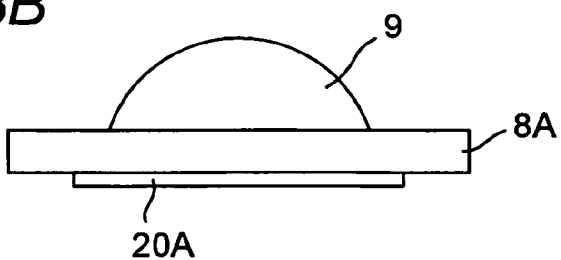
Figure 3C:
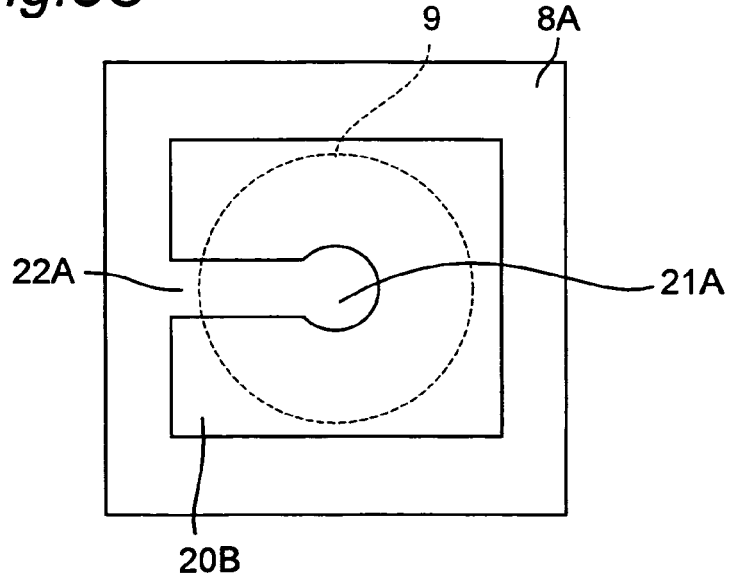
FIG. 3C is a bottom view showing still another structure of a submount.

Moreover, FIG. 3A is a bottom view showing a submount with a hole and a notch filled with transparent resin, viewed from the electrode side, FIG. 3B is side view showing the submount 8A, and FIG. 3C is a bottom view showing a submount 8A with an electrode 20B different in shape from that of FIG. 3A, viewed from the electrode side.

In FIGS. 3A and 3B, on one surface of the glass submount 8A, there is provided an electrode 20A which is electrically connected to a front-surface electrode of the semiconductor optical device (unshown), and the electrode 20A is provided with an optical path hole 21A not to block an optical portion (i.e., a light-emitting portion and a light-receiving portion) of the semiconductor optical device, and almost triangular-shaped notches 22 that respectively expand in left-hand direction and light-hand direction.

The front-surface electrode of the semiconductor optical device is electrically connected to the electrode 20A through gold-tin eutectic bonding, use of an Ag paste, use of an Au bump and so forth as described above.

The optical path hole 21A is filled with a transparent resin for preventing degradation of transmission efficiency or reception efficiency of the semiconductor optical device.

In the case of the submount 8A in FIGS. 3A and 3B, first, the front-surface electrode of the semiconductor optical device and the electrode 20A of the submount 8A are electrically connected, and then a transparent resin is filled from the hole 21A or a notch 22 provided on the electrode 20A, so that a space between the semiconductor optical device and the submount 8A is filled with the transparent resin. In this case, an excessive amount portion of the transparent resin filled in the optical path hole 21A is guided and spreads to the notch 22 side, which ensures filling of the transparent resin.

In an example of FIG. 3C, the submount 8A is provided with the electrode 20B having an optical path hole 21A and a rectangular-shaped notch 22A. The optical path hole 21A and the rectangular-shaped notch 22A have the same functions as those of FIG. 3A.

Further, as shown in FIGS. 1A and 1B, the semiconductor optical device 3, the wire 5 and the signal processing circuit 12 are covered with a molding portion 10 made of a non-transparent molding resin which includes a 70 wt % or more filler so as to have a coefficient of linear expansion not so different from that of the wire 5, and to have high heat conductivity and excellent environment resistance. Moreover, the lead frame 4 is covered with the molding portion 10 except lead terminals 4a. Also a surface (front surface) of the lead frame 4 opposite to one surface on which the semiconductor optical device 3 is disposed is enclosed with the molding portion 10 except a portion of the aperture 7. The semiconductor optical device 3 is optically coupled with the optical fiber 2 through the transparent resin portion 11, the glass submount 8, the lens 9 and the aperture 7 of the lead frame 4.

Description is now given of a manufacturing method of the optical coupler 1 in the first embodiment.

First, an electrode formed on the optical portion 6-side surface of the semiconductor optical device 3 and an electrode formed on the glass submount 8 are electrically connected. The electric connection between the electrode of the glass submount 8 and the electrode of the semiconductor optical device 3 is established by a method involving conductivity such as gold-tin eutectic bonding, soldering, use of an Ag paste, use of an Au bump and so forth. In this stage, a space between the semiconductor optical device 3 and the glass submount 8 is filled with a transparent resin.

Next, the glass submount 8 is bonded to the lead frame 4 in such a way that the optical portion of the semiconductor optical device 3 which is electrically connected to the glass submount 8 faces the aperture 7 of the lead frame 4. The bonding of the glass submount 8 and the lead frame 4 is achieved with an adhesive, an Ag paste and so forth. In this case, it is desirable to use an adhesive having high heat conductance in consideration of heat dissipation of the semiconductor optical device 3.

Next, the signal processing circuit 12 is bonded to the lead frame 4 with an adhesive such as Ag pastes. It is desirable to use an adhesive having high heat conductance in consideration of heat dissipation of the semiconductor optical device 3.

Next, a rear-surface electrode of the semiconductor optical device 3, the electrode provided on the glass submount 8 and the signal processing circuit 12 are electrically connected to the lead frame 4 through wire 5.

Next, there is conducted transfer molding of the molding portion 10 made of a non-transparent molding resin including a 70 wt % or more filler. The molding portion 10 made of a non-transparent molding resin has a coefficient of linear expansion not so different from that of the wire 5, and has high heat conductivity and excellent environment resistance. Herein, a mold is pressed to periphery of the aperture 7 to close the aperture 7 from the front surface-side of the lead frame 4 so as to prevent the molding portion 10 made of a molding resin from coming into the aperture 7 from the front surface side of the lead frame 4.

As shown in FIG. 1A, an alignment guide portion 10a for the optical fiber 2 that exemplifies a hole portion is provided on the molding portion 10 in the vicinity of the aperture 7 on the front surface side of the lead frame 4, by which an optical fiber 2 can be accurately positioned. The alignment guide portion 10a is a conical surface.

Although not stated in the first embodiment, the alignment of an optical fiber may be performed by positioning a plug provided on an end surface of the optical fiber by the alignment guide portion 10a.

Figure 4A:
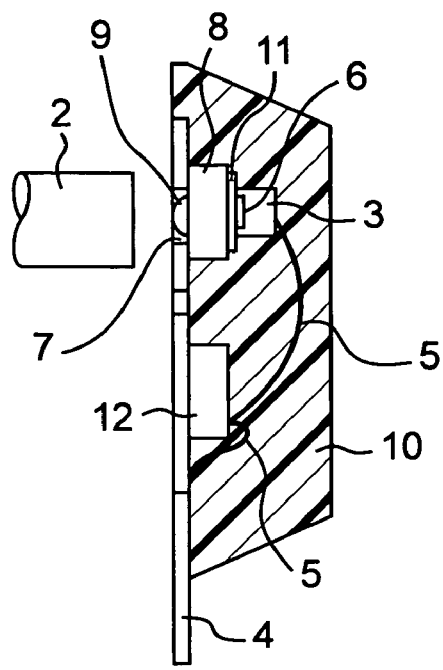
FIGS. 4A and 4B are a schematic sectional view and a front view respectively showing an outlined structure of another optical coupler with a different molding portion according to the first embodiment of the present invention.
Figure 4B:
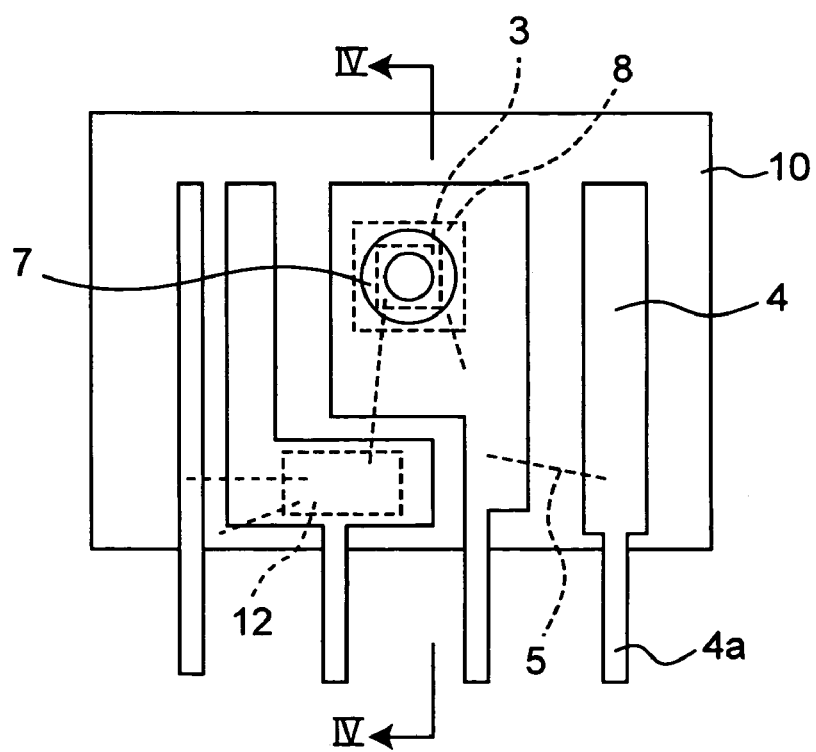

Further, FIG. 4A is a schematic sectional view showing another optical coupler, and FIG. 4B is a front view showing the optical coupler viewed from the side of the optical fiber 2. FIG. 4A shows a section taken along the line IV-IV of FIG. 4B. The optical coupler shown in FIGS. 4A and 4B has the same structure as the optical coupler shown in FIGS. 1A and 1B except a molding portion, and therefore like component members are designated by like reference numerals to omit their explanation.

As shown in FIGS. 4A and 4B, the optical coupler may be structured such that the molding portion 10 made of a non-transparent molding resin does not come into the aperture 7 of the lead frame 4. In the optical coupler in FIGS. 4A and 4B, like the optical coupler in FIGS. 1A and 1B, a mold for transfer molding is pressed to the entire front surface of the lead frame 4 so as to prevent the molding portion 10 made of a molding resin from coming into the front surface side of the lead frame 4. This structure allows downsizing of the optical coupler and space saving.

Figure 5A:
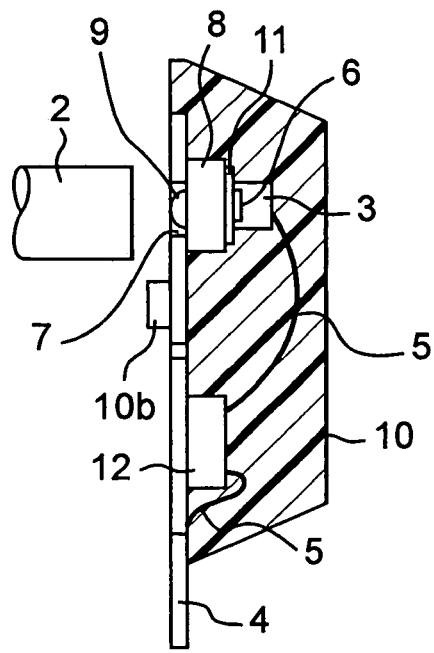
FIGS. 5A and 5B are a schematic sectional view and a front view respectively showing an outlined structure of still another optical coupler with a different molding portion according to the first embodiment of the present invention.
Figure 5B:
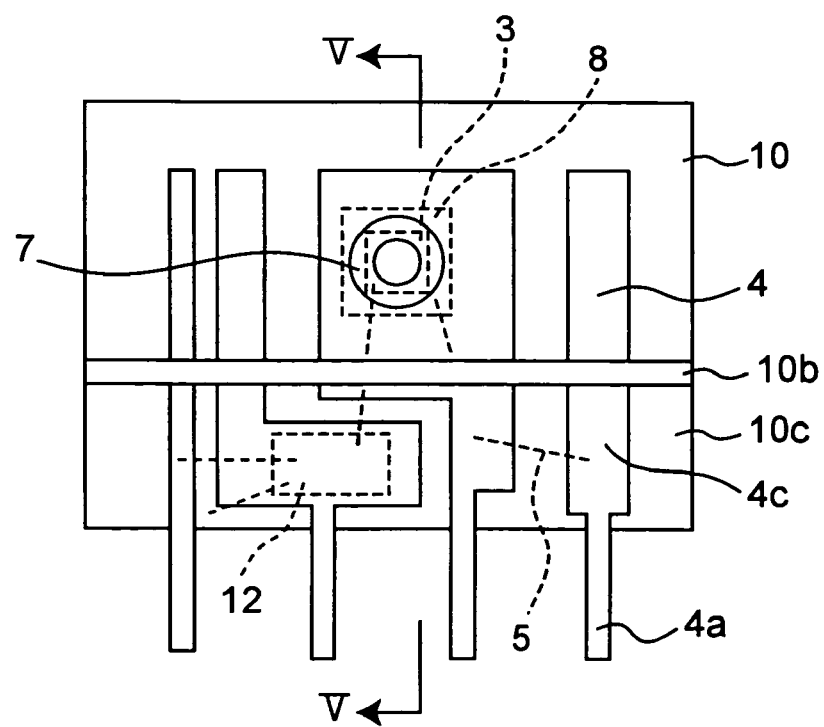

Further, FIG. 5A is a schematic sectional view showing another optical coupler, and FIG. 5B is a front view showing the optical coupler viewed from the side of an optical fiber 2. FIG. 5A shows a section taken along the line V-V of FIG. 5B.

As shown in FIGS. 5A and 5B, the optical coupler is structured such that the molding portion 10 made of a non-transparent molding resin does not come into the aperture 7 of the lead frame 4, and an engagement portion 10b made of a non-transparent molding resin is provided on part of exposed surface sides 4C, 10C of the lead frame 4 and the molding portion 10. This structure allows downsizing of the optical coupler and space saving, and also enables the molding portion 10 made of a non-transparent molding resin to be surely engaged to the lead frame 4, thereby making it possible to realize the optical coupler with high reliability.

Although a glass submount is used as the submount having transparency in the first embodiment, a transparent material such as transparent resins may also be used.

As is clear from the above description, according to the optical coupler 1 of the first embodiment, even in the case where the small-size semiconductor optical device 3 such as PDs and LEDs is used, it is possible with a simple structure to encapsulate the semiconductor optical device 3 and the wire 5 with the molding portion 10 which is made of a non-transparent molding resin including a filler and excellent in environment resistance, which makes it possible to provide a small-size optical coupler with excellent environment resistance and high reliability at a low cost.

The Second Embodiment

Figure 6A:
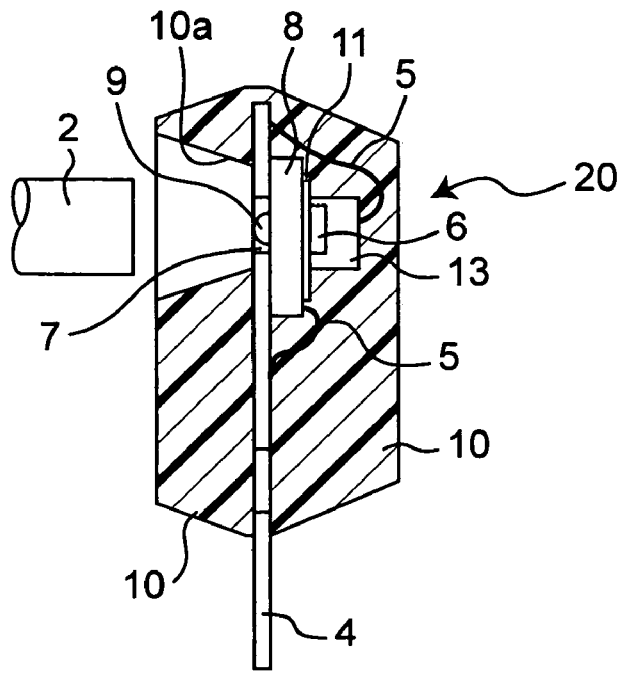
FIGS. 6A and 6B are a schematic sectional view and a front view respectively showing an outlined structure of an optical coupler according to a second embodiment of the present invention.
Figure 6B:
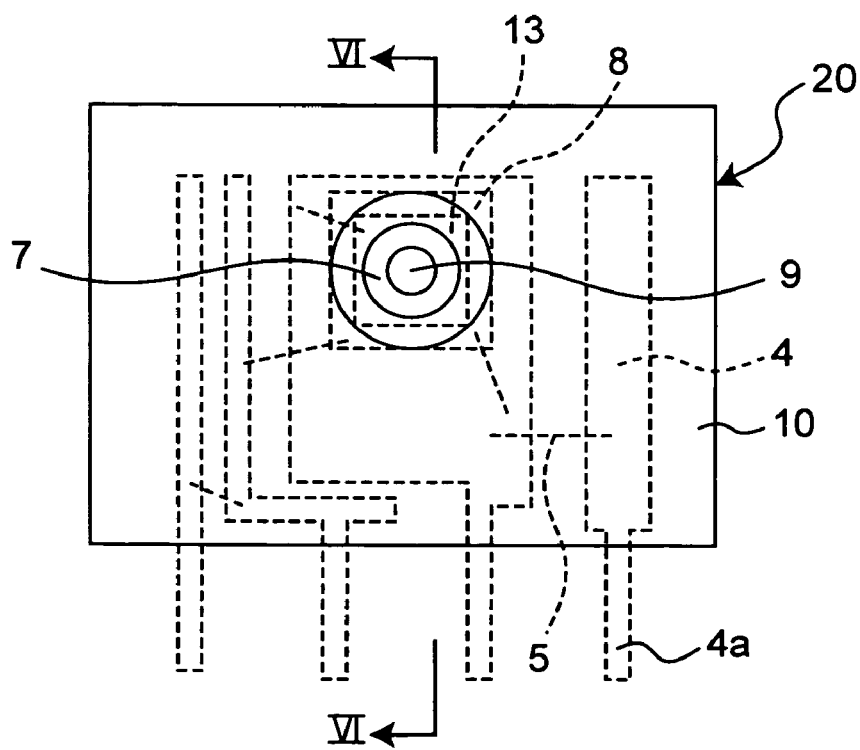

FIG. 6A is a schematic sectional view showing an outlined structure of an optical coupler according to a second embodiment of the present invention, and FIG. 6B is a front view showing the optical coupler viewed from the side of an optical fiber 2. FIG. 6A shows a section taken along the line VI-VI of FIG. 6B.

The optical coupler in the second embodiment is different from the optical coupler in the first embodiment of FIGS. 1A and 1B in the point that an IC (Integrated Circuit) 13 is mounted on a glass submount 8, wherein the IC 13 is a single chip incorporating a light-receiving device in the case where the semiconductor optical device is the light-receiving device 3 and an amplifying integrated circuit that is the signal processing circuit 12 in FIGS. 1A and 1B showing the first embodiment.

The IC 13 formed as a single chip is mounted at the same position as that of the semiconductor optical device 3 in the first embodiment. Other aspects of the optical coupler including a mounting method and a structure are the same as the first embodiment. Since the optical coupler has the same structure as the optical coupler in the first embodiment, like component members are designated by like reference numerals to omit explanation thereof.

In this second embodiment, the IC 13 and the wire can be encapsulated with the molding portion 10 made of a non-transparent molding resin including a filler and excellent in environment resistance with a simple structure, thereby making it possible to provide an optical communication device with excellent environment resistance at a low cost.

Further, since the light-receiving device and the amplifying integrated circuit are formed into a single chip as the IC 13, the optical coupler 20 does not need wire between the light-receiving device and the amplifying integrated circuit, so that a stray capacitance is reduced and fast response is obtainable, while at the same time the optical coupler 20 becomes less susceptible to an influence of electromagnetic noise. Moreover, since the number of chips is decreased, manufacturing is facilitated and cost reduction can be achieved.

The Third Embodiment

Figure 7A:
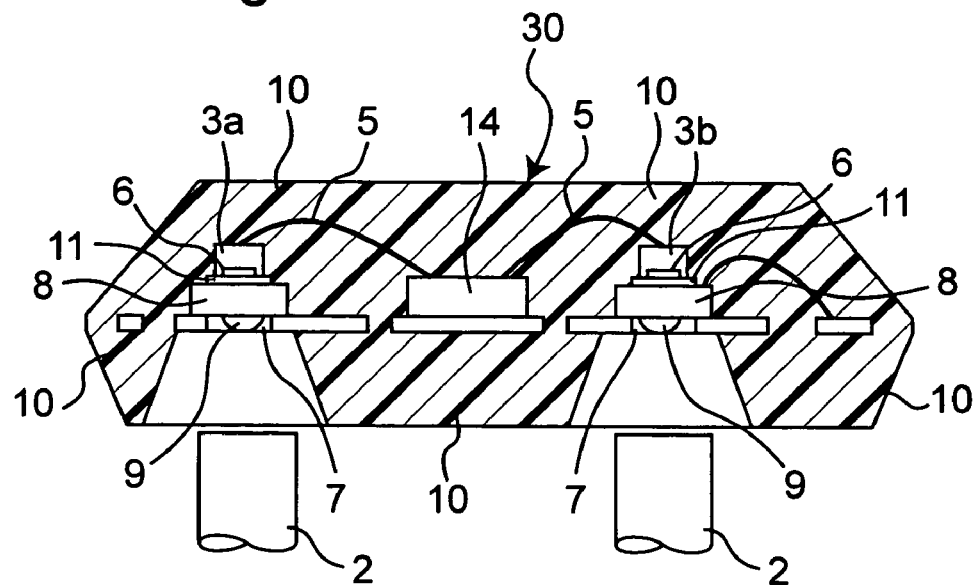
FIGS. 7A and 7B are a schematic sectional view and a front view respectively showing an outlined structure of an optical coupler according to a third embodiment of the present invention.
Figure 7B:
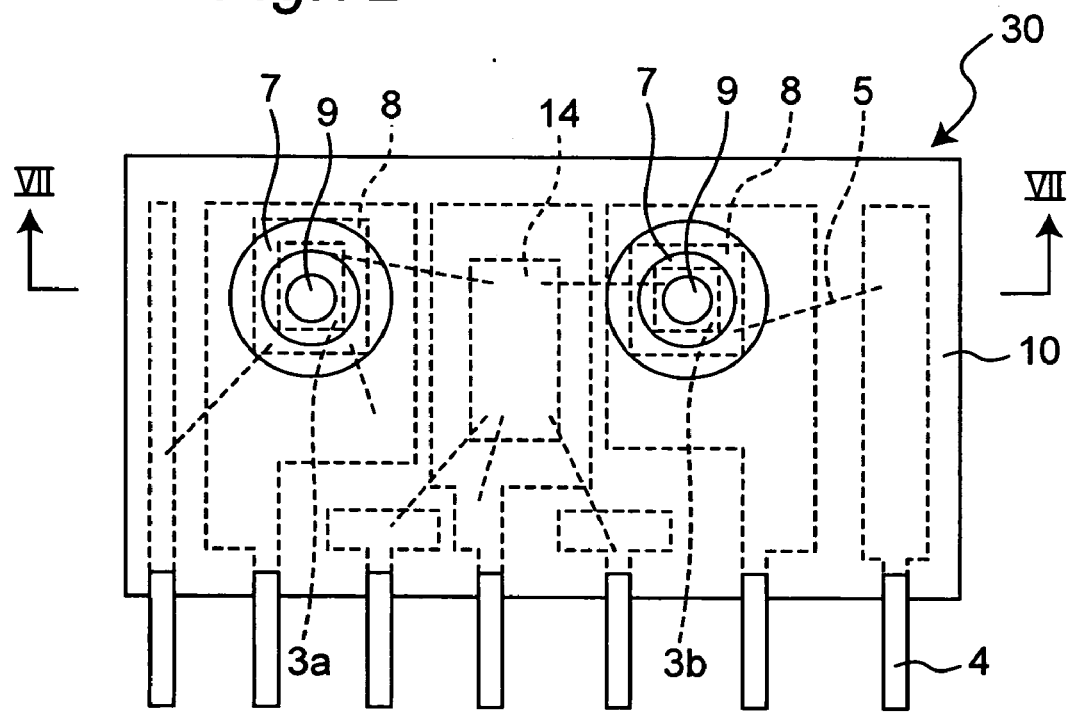

FIG. 7A is a schematic sectional view showing an outlined structure of an optical coupler according to a third embodiment of the present invention, and FIG. 7B is a front view showing the optical coupler viewed from the side of optical fibers 2. FIG. 7A shows a section taken along the line VII-VII of FIG. 7B.

The optical coupler in the third embodiment is different from the optical coupler of the first embodiment in the point that a light-emitting device 3b, a light-receiving device 3a, and an IC 14 composed of a driving integrated circuit for the light-emitting device 3b and an amplifying integrated circuit for the light-receiving device 3a are incorporated in a single package. Other aspects are the same as the first embodiment.

In the optical coupler of the third embodiment, the light-emitting device 3b, the light-receiving device 3a and the IC 14 are incorporated in a single package, which makes it possible to structure an optical coupler for transmission and reception with the single package.

Generally, in the case where the optical coupler for transmission and reception has a configuration of a single package, due to light reflection inside the package, transmission light from the light-emitting device is coupled to the light-receiving device to make a noise (stray light noise) component, which sometimes causes malfunction and degradation of communication quality. In order to prevent the stray light noise, a light shielding plate and the like need to be mounted, which makes manufacturing difficult and increases a manufacturing cost.

To the contrary, the optical coupler of the third embodiment uses the molding portion 10 made of a non-transparent molding resin, so that there is no light reflection inside the package and therefore the transmission light from the light-emitting device 3b is not coupled to the light-receiving device 3a. Consequently, the stray light noise is not generated, and so an influence of stray light noise can be eliminated without a complicated mechanism, which allows communication with high communication quality and makes it possible to achieve downsizing.

In FIGS. 7A and 7B, the driving integrated circuit for the light-emitting device and the amplifying integrated circuit for the light-receiving device which serve as signal processing circuits are formed in a single chip. However, the circuits may respectively have configurations of separate chips. Moreover, like the second embodiment, the light-receiving device and the amplifying integrated circuit for the light-receiving device may be structured as a single chip and the driving integrated circuit for the light-emitting device may be provided separately.

As is clear from the above description, according to the optical coupler of the third embodiment, even in the case of where the small-sized semiconductor optical devices 3a and 3b such as PDs and LEDs are used to structure an optical coupler for transmission and reception, it is possible with a simple structure to encapsulate the semiconductor optical devices 3a, 3b and the wire 5 with the molding portion 10 which is made of a non-transparent molding resin including a filler and excellent in environment resistance, which makes it possible to provide the optical coupler 1 with excellent environment resistance at a low cost.

The Fourth Embodiment

A fourth embodiment of the present invention is characterized in that the driving integrated circuit for the light-emitting device and the amplifying integrated circuit for the light-receiving device in the third embodiment includes an output external connection terminal and an input external connection terminal for supplying and receiving information regarding the operational states and control information. Other aspects are the same as the third embodiment.

Figure 8:
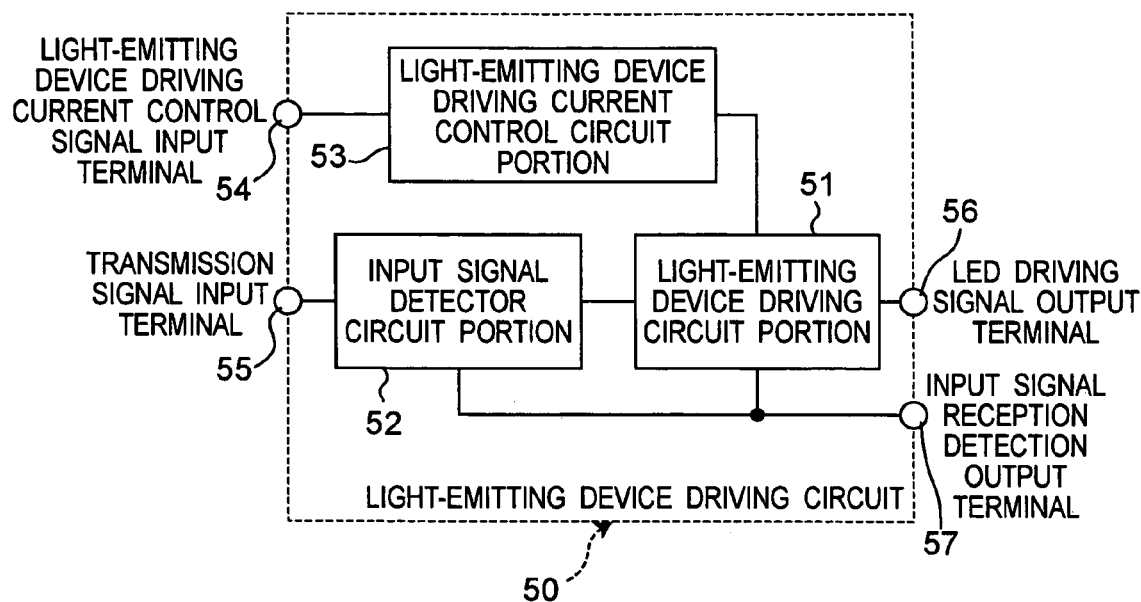
FIG. 8 is an explanatory view showing an outlined structure of a light-emitting device driving circuit in an optical coupler according to a forth embodiment of the present invention.

FIG. 8 shows a structure of a light-emitting device driving circuit 50 that exemplifies a driving integrated circuit for a light-emitting device in the optical coupler in the fourth embodiment. The light-emitting device driving circuit 50 is composed of a light-emitting device driving circuit portion 51, an input signal detector circuit portion 52, and a light-emitting device driving current control circuit portion 53, all of which are formed in a single chip. The input signal detector circuit portion 52 has a function to detect the input of a transmission signal and to output a signal representing it. Based on the signal from the input signal detector circuit portion 52, the light-emitting device driving circuit portion 51 is put in a standby state when there is no input signal, and the light-emitting device driving circuit portion 51 is put in an operational state upon detection of an input signal. In FIG. 8, there are shown a light-emitting device driving current control signal input terminal 54, a transmission signal input terminal 55, an LED driving signal output terminal 56, and an input signal reception detection output terminal 57. The light-emitting device driving current control signal input terminal 54 and the transmission signal input terminal 55 are examples of input external connection terminals, while the LED driving signal output terminal 56 and the input signal reception detection output terminal 57 are examples of output external connection terminals.

With such a structure, it becomes possible to reduce power consumption during the standby state. Moreover, by providing the input signal reception detection output terminal 57 to the outside, it also becomes possible to reduce power consumption during the standby state in other peripheral circuits in a similar manner.

Moreover, the light-emitting device driving current control circuit portion 53 controls the light-emitting device driving circuit portion 51 on the basis of light-emitting device driving current control signal from the outside to control driving current of the light-emitting device. For instance, an LED serving as a light-emitting device has a characteristic that its optical output drops at a high temperature. With use of the light-emitting device driving current control circuit portion 53 of the fourth embodiment, it becomes possible to increase driving current at a high temperature, increase optical output, and reduce optical drop at a high temperature, which makes it possible to achieve communication with high communication quality.

Moreover, LEDs serving as light-emitting devices have dispersion in optical outputs, and further, due to mounting variations during manufacturing process, optical outputs from transmitters exhibit dispersion. In the fourth embodiment, it is possible to control an optical output from the LED with the driving current based on light-emitting device driving current control signals from the outside, so that the optical output from a transmitter can be monitored and matched with a specified optical output, thereby achieving communication with high communication quality.

Figure 9:
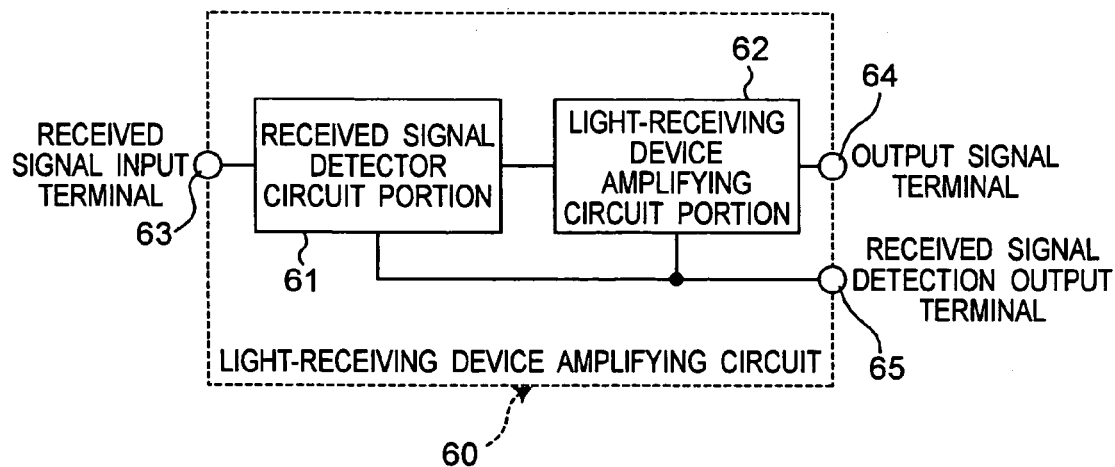
FIG. 9 is an explanatory view showing an outlined structure of a light-receiving device amplifying circuit in the optical coupler.
Figure 10:
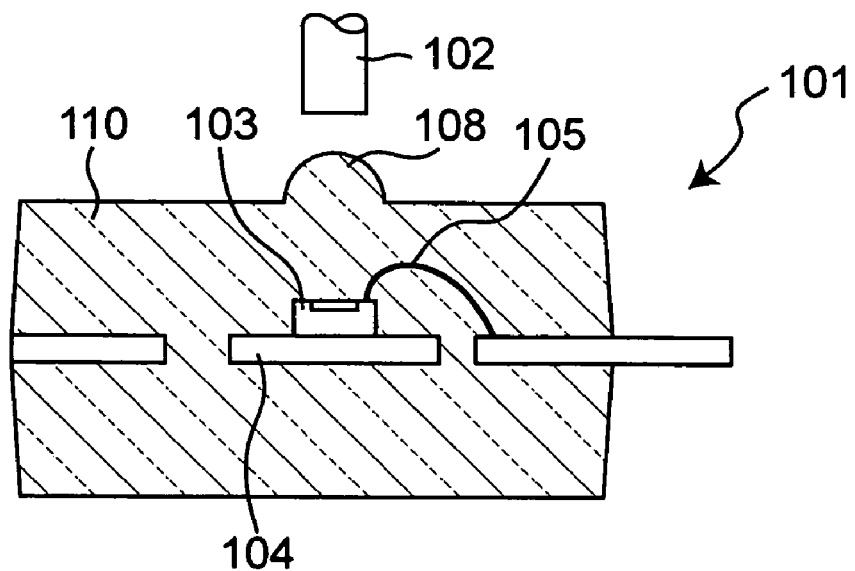
FIG. 10 is a sectional view showing an outlined structure of a conventional optical coupler.
Figure 11:
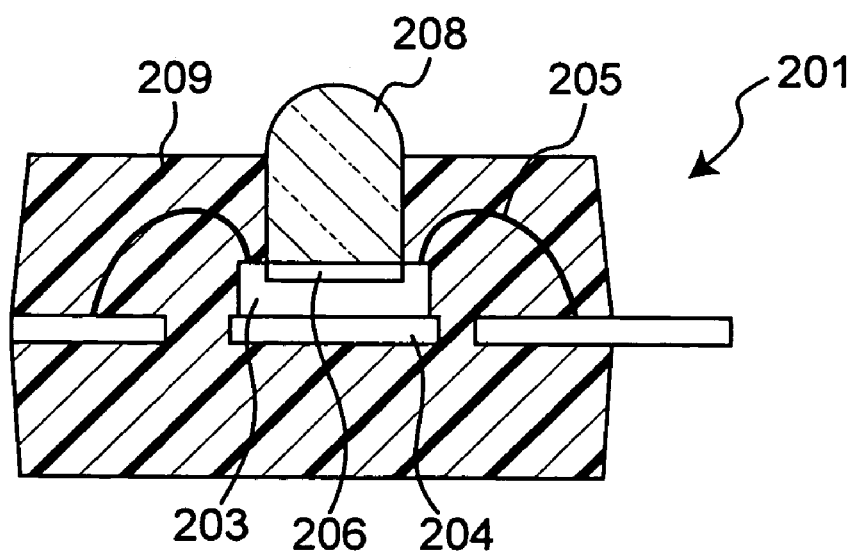
FIG. 11 is a sectional view showing an outlined structure of another conventional optical coupler.

Further, FIG. 9 shows a structure of a light-receiving device amplifying circuit 60 that exemplifies an amplifying integrated circuit for the light-receiving device in the fourth embodiment. The light-receiving device amplifying circuit 60 is composed of a received signal detector circuit portion 61 and a light-receiving device amplifying circuit portion 62, both of which are formed in a single chip. The received signal detector circuit portion 61 has a function to detect input of received signals and to output detection signals. In FIG. 9, there are shown a received signal input terminal 63, an output signal terminal 64, and a received signal detection output terminal 65. The terminal 63 is an example of an input external connection terminal, while the output signal terminal 64 and the received signal detection output terminal 65 are examples of output external connection terminals.

Based on a detection signal from the received signal detector circuit portion 61, the light-receiving device amplifying circuit portion 62 is put in a standby state when there is no received signal, and the light-receiving device amplifying circuit portion 62 is put in an operational state upon detection of a received signal. With such a structure, it becomes possible to reduce power consumption during the standby state. Moreover, by providing the received signal detection output signal terminal 65, it also becomes possible to reduce power consumption during the standby state in other peripheral circuits in a similar manner.

As described above, in the optical coupler composed of the light-emitting device driving circuit 50 and the light-receiving device amplifying circuit 60 stated in the fourth embodiment, the light-emitting device driving circuit 50 and the light-receiving device amplifying circuit 60 incorporate the output external connection terminals and the input external connection terminals for receiving and supplying information regarding the operational states and control information, so that the operation of signal processing circuit can be controlled with detection signals and input signals from the outside, thereby achieving a sophisticated communication with high communication quality.

In the optical coupler in the fourth embodiment, the light-emitting device driving circuit 50 is composed of the light-emitting device driving circuit portion 51, the input signal detector circuit portion 52, and the light-emitting device driving current control circuit portion 53 for detecting the presence and absence of transmission signal input and for controlling light-emitting device driving current with light-emitting device driving current control signals from the outside. In addition to the above, integrating the light-emitting device driving circuit 50 with light-receiving device amplifying circuit 60 allows the light-emitting device driving circuit 50 to control itself only with internal communication without the aid of external control signals or the like, that is, for instance, the light-emitting device driving circuit 50 can control the light-emitting device driving current based on a control signal from the light-receiving device amplifying circuit 60.

Further, although the light-emitting device driving circuit 50 is constituted by the light-emitting device driving circuit portion 51, the input signal detector circuit portion 52 and the light-emitting device driving current control circuit portion 53, a logic circuit for controlling the light-emitting device driving circuit may also be incorporated.

Further, although the light-receiving device amplifying circuit 60 is constituted by the received signal detector circuit portion 61 and the light-receiving device amplifying circuit portion 62, a logic circuit for controlling the light-receiving device amplifying circuit 60 may also be incorporated.

The optical coupler of the present invention is used in electronic equipment such as digital TV (televisions) sets, digital BS (Broadcasting Satellite) tuners, CS (Communication Satellite) tuners, DVD (Digital Versatile Disc) players, super audio CD (Compact Disc) players, AV (Audio Visual) amplifiers, audios, personal computers, personal computer peripherals, cellular phones and PDAs (Personal Digital Assistants). The optical coupler of the present invention is also used in electronic equipment in the environment with a wide operating temperature range, for instance, in-car equipment such as car audios, automotive navigation systems and sensors, as well as factory robot sensors and control equipment.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An optical coupler, comprising:
   a lead flame having an aperture passing through in thickness direction thereof;
   a submount having transparency which is disposed on one surface of the lead frame so as to close the aperture of the lead frame;
   a semiconductor optical device which is disposed on a surface of the submount opposite to a surface of the submount facing the aperture of the lead frame in such a way that an optical portion of the semiconductor optical device faces toward the aperture, and which is electrically connected to the lead frame via wire; and
   a molding portion made of a non-transparent molding resin for encapsulating at least one surface of the lead frame, the semiconductor optical device and the submount in a state that the aperture on the other surface side of the lead frame is exposed, wherein the molding portion is brought in close contact with the semiconductor optical device and the submount.

2. The optical coupler as defined in claim 1, wherein the non-transparent molding resin includes a 70 wt % or more filler.

3. The optical coupler as defined in claim 1, wherein
the submount is provided with an electrode which is electrically connected to a front-surface electrode of the semiconductor optical device.

4. The optical coupler as defined in claim 1, wherein
a space between the submount and the optical portion of the semiconductor optical device is filled with a transparent resin.

5. The optical coupler as defined in claim 3, wherein
the electrode mounted on the submount has at least one notch.

6. The optical coupler as defined in claim 1, wherein
the submount has a lens which is disposed inside the aperture of the lead frame.

7. The optical coupler as defined in claim 1, further comprising
a signal processing integrated circuit which is disposed on the lead frame and is electrically connected to the semiconductor optical device.

8. The optical coupler as defined in claim 7, wherein
the semiconductor optical device is a light-receiving device, and the signal processing integrated circuit is an amplifying integrated circuit for amplifying an output signal from the light-receiving device, and
the light-receiving device and the amplifying integrated circuit are formed in a single chip.

9. The optical coupler as defined in claim 7, wherein
the semiconductor optical device includes a light-emitting device and a light-receiving device, and
the signal processing integrated circuit includes a driving integrated circuit for driving the light-emitting device and an amplifying integrated circuit for amplifying an output signal from the light-receiving device.

10. The optical coupler as defined in claim 9, wherein
the driving integrated circuit and the amplifying integrated circuit are formed in a single chip.

11. The optical coupler as defined in claim 7, wherein
the signal processing integrated circuit includes at least one of an output external connection terminal for outputting information regarding operational states and an input external connection terminal for receiving control information.

12. The optical coupler as defined in claim 1, wherein
the molding portion made of the non-transparent molding resin is provided in such a way that substantially all of the other surface of the lead frame is exposed.

13. The optical coupler as defined in claim 12, wherein
the molding portion made of the non-transparent molding resin has an engagement portion provided on the other surface side of the lead frame in such a way that the lead frame is interposed in between the molding portion on the one surface side of the lead frame and the engagement portion.

14. The optical coupler as defined in claim 1, wherein
the molding portion made of the non-transparent molding resin covers the other surface of the lead frame except a hole portion that exposes the aperture.

15. The optical coupler as defined in claim 14, wherein
the hole portion in the molding portion made of the non-transparent molding resin is shaped to become narrower from its opening toward the aperture side of the lead frame.

* * * * *